United States Patent [19]
Nariishi et al.

[11] Patent Number: 5,187,556
[45] Date of Patent: Feb. 16, 1993

[54] CMOS MASTER SLICE

[75] Inventors: Masaaki Nariishi; Noboru Yamakawa; Osamu Ohba; Naoyasu Seki, all of Tokyo, Japan

[73] Assignee: Kawasaki Steel Corporation, Hyogo, Japan

[21] Appl. No.: 743,089

[22] Filed: Aug. 9, 1991

[30] Foreign Application Priority Data

Aug. 13, 1990 [JP] Japan .................................. 2-214017
Aug. 17, 1990 [JP] Japan .................................. 2-216487
Aug. 17, 1990 [JP] Japan .................................. 2-216488

[51] Int. Cl.⁵ ........................................... H01L 27/02
[52] U.S. Cl. ................................................. 257/206
[58] Field of Search ............................ 357/42, 45, 55

[56] References Cited

U.S. PATENT DOCUMENTS

5,038,192  8/1991  Bonneau et al. ...................... 357/42
5,060,046 10/1991  Shintani ................................. 357/42

OTHER PUBLICATIONS

IBM Technical Disclosure Bulletin, vol. 32, No. 88, Jan. 1990, p. 37.
Patent Abstracts of Japan, vol. 7, No. 52 (E-162) [1197], Mar. 2, 1983, JP-A-57 201060.
Patent Abstracts of Japan, vol. 14, No. 448 (E-983), Sep. 26, 1990, JP-A-2-177456.

*Primary Examiner*—Edward J. Wojciechowicz
*Attorney, Agent, or Firm*—Oliff & Berridge

[57] ABSTRACT

A CMOS master slice having a plurality of regularly arranged basic cells improves an integration efficiency by optimizing size and arrangement of MOS transistors in the basic cells. Each of the basic cells comprises a first pair of transistors having gates thereof arranged to parallelly face each other, and a second pair of transistors having gate electrodes shorter in gate width than that of the first pair of transistors and parallel to the gate electrodes of the first pair of transistors. In adjacent basic cells, the gate electrodes of adjacent second transistors are substantially on a line so that a wasteful space is eliminated.

11 Claims, 6 Drawing Sheets

CMOS MASTER SLICE

BACKGROUND OF THE INVENTION

1. Field of the Invention

The present invention relates to a master slice used in a gate array type LSI, and more particularly to a CMOS master slice in which a set of basic cells each comprising p-channel MOS transistors and n-channel MOS transistors are, arranged regularly.

2. Related Background Art

Figure 1:
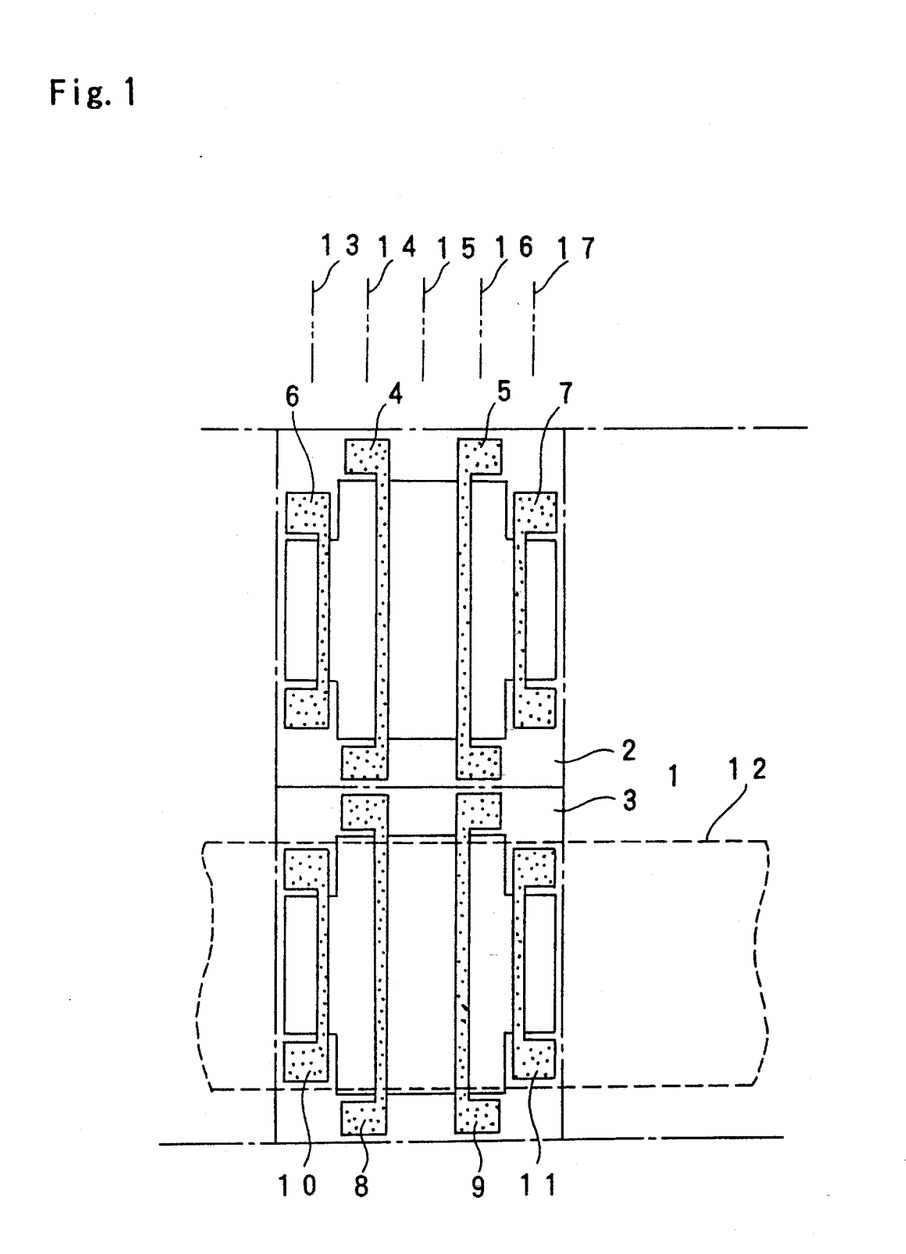
FIG. 1 shows a plan view of a basic cell used in a prior art gate spread type CMOS master slice.

FIG. 1 shows a plan view of a basic cell used in a prior art gate spread type CMOS master slice. A basic cell 1 comprises a p-channel region 2 and an n-channel region 3. In the p-channel region 2, two p-channel large MOS transistors shown by gates 4 and 5, and two p-channel small MOS transistors shown by gates 6 and 7 are formed. In the n-channel region 3, two n-channel large MOS transistors shown by gates 8 and 9, and two n-channel small MOS transistors shown by gates 10 and 11 are formed. Numeral 12 denotes a p-well region formed on an n-type semiconductor substrate, and numerals 13-17 denote wiring tracks along the width of the gates.

At the beginning of the development of the gate array, it was a general practice that the gate widths of all MOS transistors in a basic cell are equal. However, since it is frequently advantageous in circuit performance the gate width is selectable depending on an application, MOS transistors having different gate widths are incorporated in one basic cell in a recent device.

In the basic cell, the basic MOS transistors 4, 5, 8 and 9 having the wider gate width are used as latch transistors, and n-channel additional MOS transistors 10 and 11 having the narrower gate width are used as path transistors to form one unit of a high performance SRAM memory circuit having a short access time.

However, where transistors having different gate widths are incorporated in one basic cell, wasteful spaces rae created on both sides of each of the pads of the narrow gate width transistors 6, 7, 10 and 11 and an integration efficiency is low.

SUMMARY OF THE INVENTION

It is an object of the present invention to provide a CMOS master slice having MOS transistors of different gate widths incorporated in a basic cell, which includes no wasteful space and offers a high integration efficiency.

It is a specific object of the present invention to provide a CMOS master slice having a basic cell comprising a group of p-channel MOS transistors and a group of n-channel MOS transistors, each of the transistor groups including a first pair transistors having gates thereof arranged to face parallelly to each other and second transistors disposed on both sides of the first transistor and having gate electrodes shorter in width than those of the first transistor and parallel to the gate electrodes of the first transistor, wherein the CMOS master slice include no wasteful space.

In order to achieve the above objects, in the CMOS master slice of the present invention, the transistors are arranged such that the gate electrodes of adjacent second transistors of adjacent basic cells are substantially on a line.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

Figure 2:
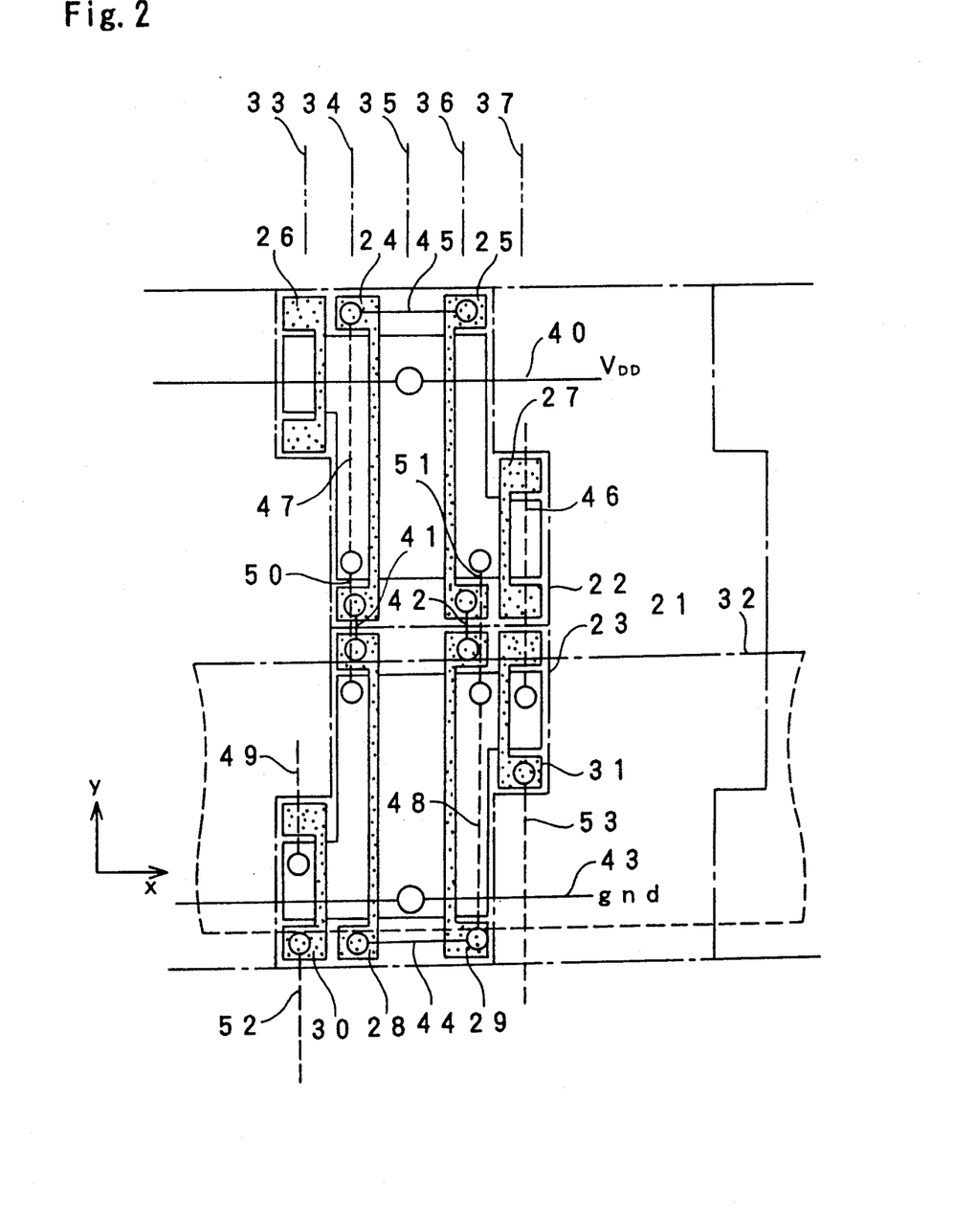
FIG. 2 shows a plan view of a basic cell of a CMOS master slice in accordance with a first embodiment of the present invention.

As shown FIG. 2, a basic cell 21 comprises a p-channel region 22 and an adjacent n-channel region 23. In the present embodiment, a number of basic cells are arranged on an n-type semiconductor substrate, and a p-type well region 32 is formed in the n-channel region 23. In the p-channel region 22, two p-channel large MOS transistors shown by gates 24 and 25, and two p-channel small MOS transistors shown by gates 26 and 27 are formed. In the n-channel region 23, two n-channel large MOS transistors shown by gates 28 and 29, and two n-channel small MOS transistors shown by gates 30 and 31 are formed.

A gate width $W_2$ of each of the gates 26, 27, 30 and 31 of the small MOS transistors are selected to be no larger than one half of a gate width $W_1$, of each of the gates 24, 25, 28 and 29 of the large MOS transistors.

The gates 26 and 27 of the small MOS transistors are staggered to each other in a direction of gate width (y direction) in the p-channel region 22 so that the gates do not overlap in the direction of gate width. Similarly, the gates 30 and 31 of the small MOS transistors are staggered to each other in the direction of gate width in the n-channel region 23 so that they do not overlap.

In the present arrangement, two right-hand small MOS transistors of a basic cell (not shown) which is left-adjacent to the basic cell 21 are arranged between the small MOS transistors which have the gates 26 and 30. In other words, those four small MOS transistors are arranged in line on a wiring track 33. On the other hand, two left-hand small MOS transistors of a basic cell which is right-adjacent to the basic cell 21 are arranged to hold the small MOS transistors having the gates 27 and 31 therebetween in line with them on a wiring track 37 to hold. Accordingly, where a number of basic cells are laterally (x direction) arranged, an average width per basic cell is equal to four wiring track width. The required area is 4/5 of that of the prior art basic cell which requires five wiring track width, and an integration factor is improved by a factor of 5/4.

Figure 3:
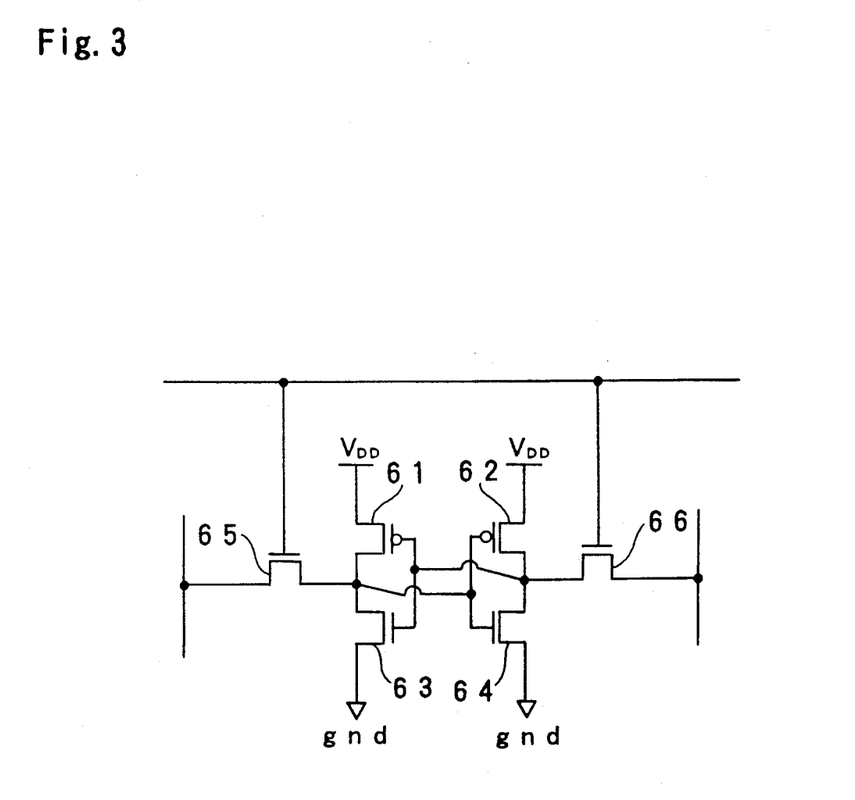
FIG. 3 shows a circuit diagram of one cell of SRAM having wiring applied to the basic cell.

FIG. 3 shows one unit of an SRAM memory circuit. It may be constructed by wiring the basic cell of FIG. 2. Wiring 40-53 shown an example thereof. Solid lines show a first layer wiring, broken lines show a second layer wiring and circles show contacts. The p-channel MOS transistors 61 and 62 of FIG. 3 correspond to the p-channel MOS transistors having the gates 24 and 25 shown in FIG. 2, and the n-channel MOS transistors 63, 64, 65 and 66 of FIG. 3 correspond to the n-channel MOS transistors having the gates 28, 29, 30 and 31 shown in FIG. 2.

Figure 4:
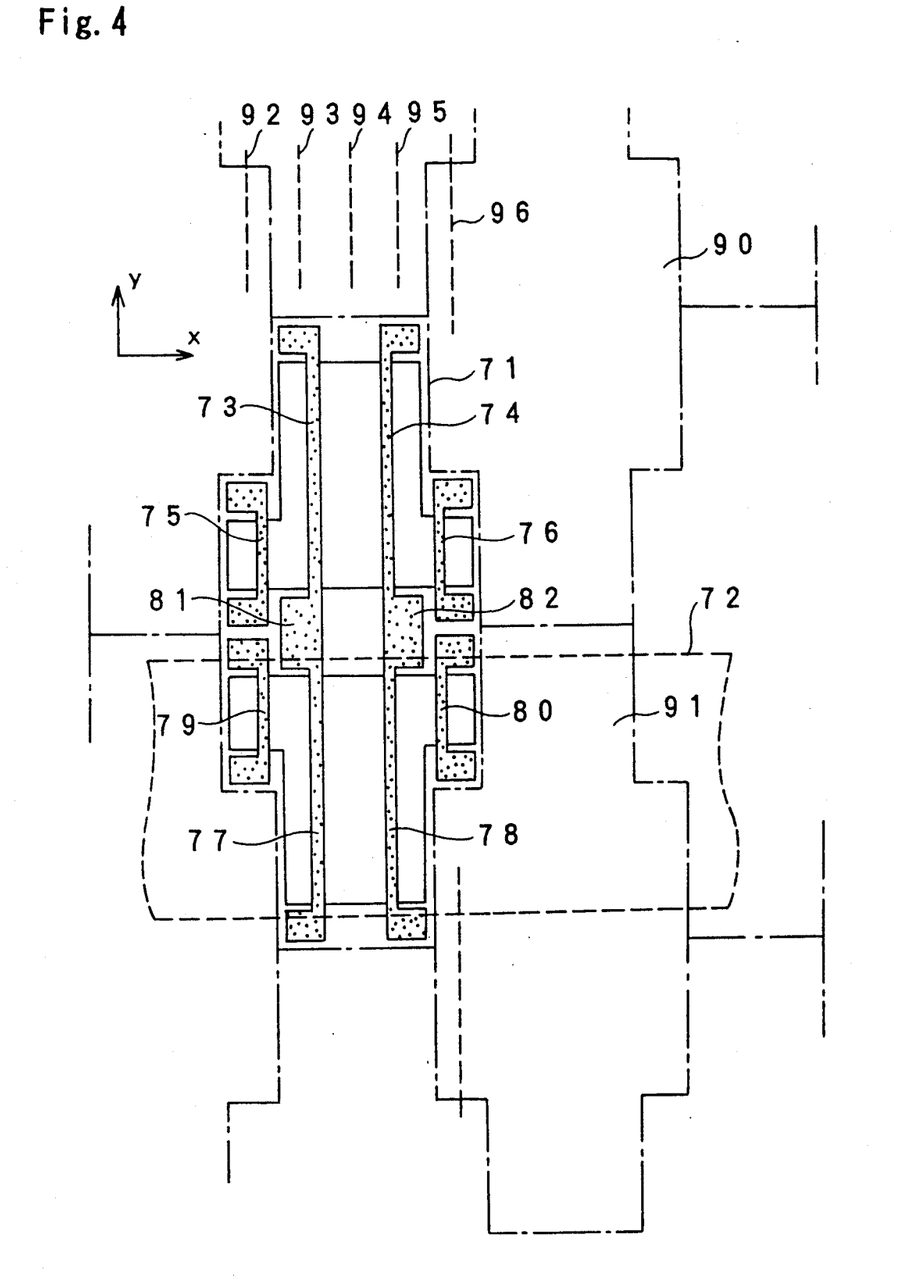
FIG. 4 shows a plan view of a basic cell of a CMOS master slice in accordance with a second embodiment of the present invention.

FIG. 4 shows a plan view of a basic cell of a CMOS master slice in accordance with a second embodiment of the present invention. The present embodiment relates to a CMOS master slice suitable to construct a random logic.

In the present embodiment, like the first embodiment, the basic cells are arranged in an n-type semiconductor substrate, and a p-type well region is partially formed. The n-channel MOS transistors are formed on the p-type well region, and the p-channel MOS transistors are formed on other region of the substrate. Numeral 72 denotes one of such p-type well regions.

Noting to the basic cell 71, four n-channel MOS transistors shown by gate electrodes 77-80 are formed in a lower-half area of the drawing, and four p-channel MOS transistors shown by gate electrodes 73-76 are formed in an upper-half area.

The p-channel MOS transistor shown by the gate 73 and the n-channel MOS transistor shown by the gate 77 form a CMOS transistors pair. Similarly, the p-channel MOS transistors and the n-channel MOS transistors shown by the gates 74 and 78, 75 and 79, and 76 and 80, respectively, form three CMOS transistor pairs. In total, four CMOS transistor pairs are formed.

The CMOS transistor pair shown by the gates 73 and 77, and the CMOS transistor pair shown by the gates 74 and 78 are referred to as basic CMOS transistor pairs as they are located at the center of the basic cell 71 with respect to the gate length (x direction), and the two pairs of CMOS transistors having narrower gate width and located on both sides of the basic CMOS transistor pairs are referred to as additional CMOS transistor pairs.

In the basic CMOS transistors are interconnected by pads 81 and 82, respectively, because both gates are to be electrically connected in order to configure the random logic. On the other hand, In the additional CMOS transistor pairs on the both sides of the basic CMOS transistor pairs, the gates of the p-channel MOS transistors and the gates of the p-channel MOS transistors are isolated, because only the n-channel MOS transistors are used as path transistors separately from the p-channel MOS transistors when the SRAM memory circuit is configured. The isolation is only electrical and the transistors are closely arranged spatially. Accordingly, when both gates are to be connected for use as a random logic circuit, they may be easily interconnected by wiring. When those CMOS transistor pairs are viewed in the direction of gate length (x direction), the gates of the p-channel MOS transistors and the gates of the n-channel MOS transistors in each of the pairs are arranged in line extending along the gate length (x direction). Namely, the center positions of the respective pairs along the gate width are aligned in each basic cell, and the region in which the p-channel MOS transistors are formed and the region in which the n-channel MOS transistors are formed are symmetric around a line.

On the other hand, a gate width $W_2$ of the additional CMOS transistor pair including input terminals to the gates is selected to be no larger than one half of a gate width $W_1$ of the basic CMOS transistor pair including input terminals to the gates. Accordingly, the additional CMOS transistor pair on the right side of the basic cell 71, and the left-hand additional CMOS transistor pairs (not shown) in the basic cells 90 and 91 which are right-adjacent to the above additional CMOS transistor pair may be arranged on the same wiring track 96 so that a number of basic cells can be arranged on the substrate without gap.

Figure 5:
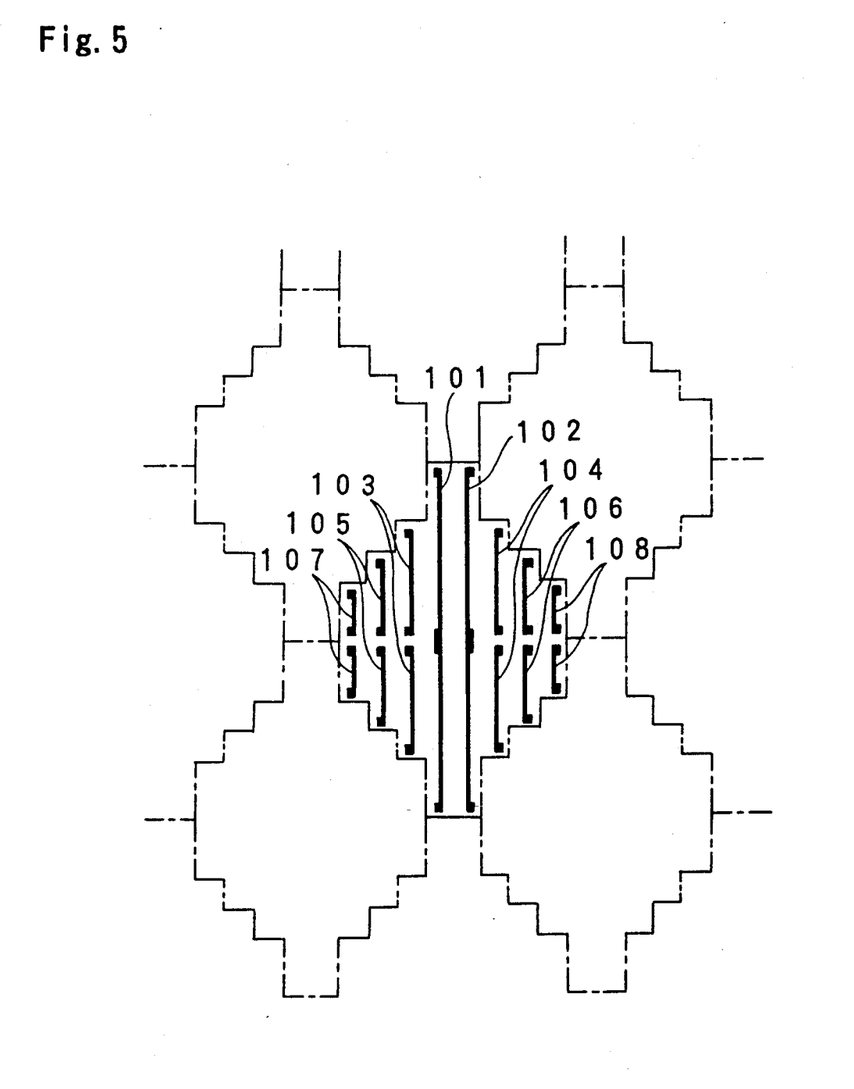
FIG. 5 shows a schematic plan view of a modification of the second embodiment in which the number of transistors is increased.

In the present embodiment, the additional CMOS transistor pairs is arranged on each of the left and right sides of the basic CMOS transistor pairs, although the number of additional CMOS transistor pairs is not limited thereto. FIG. 5 shows an embodiment in which total of six CMOS transistor pairs 103-108, namely three pairs on each of the left and right sides of the basic CMOS transistor pairs 101 and 102 are arranged. As seen from FIGS. 4 and 5, in the additional CMOS transistor pair arranged on the left side of the basic CMOS transistor pair and the additional CMOS transistor pair arranged on the right side, a sum of the gate widths of the CMOS transistor pairs having the same sequence of arrangement in a predetermined direction along the gate length, including gate input terminals, is equal to a gate width W of the basic CMOS transistor pair including the gate input terminals. Referring to FIG. 5, a sum of the gate width of the additional CMOS transistor pair 103 and the gate width of the additional CMOS transistor pair 108, a sum of the gate width of the additional CMOS transistor pair 105 and the gate width of the additional CMOS transistor pair 106, and sum of the gate width of the additional CMOS transistor pair 107 and the gate width of the additional CMOS transistor pair 104 are equal to the gate widths of the basic CMOS transistor pairs 101 and 102, respectively.

Figure 6:
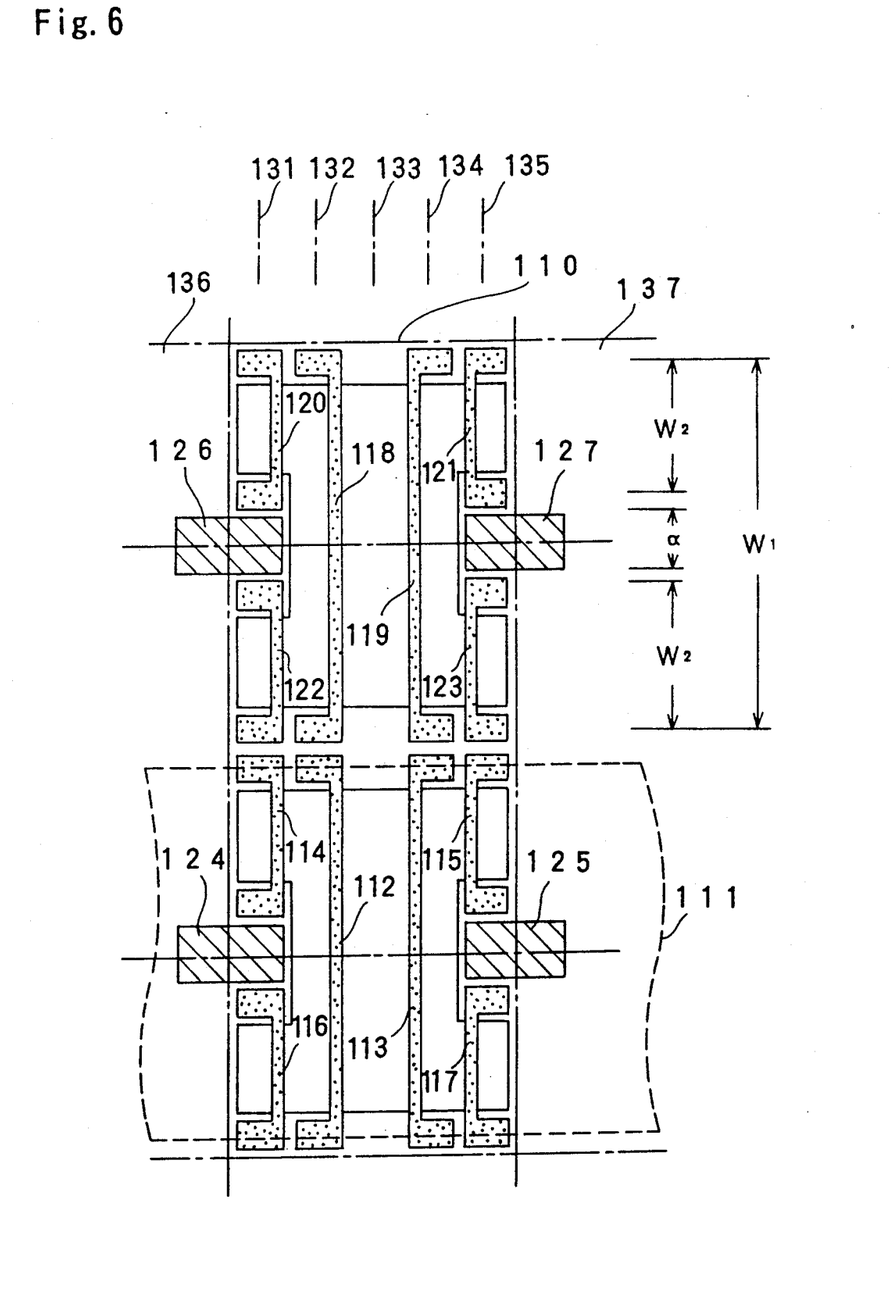
FIG. 6 shows a plan view of a basic cell of CMOS master slice in accordance with a third embodiment of the present invention.

An embodiment which improves an integration efficiency including the arrangement of body contact areas is described below referring to FIG. 6. The body contact areas are connecting areas to power supply wiring provided to set the substrate and the well region to a power supply voltage $V_{dd}$ and a ground level GND in order to prevent a latch-up phenomenon.

A basic cell 110 comprises six n-channel MOS transistors shown by gate electrodes 112-117 and six p-channel MOS transistors shown by gate electrodes 118-123. Those n-channel MOS transistors and p-channel MOS transistors are arranged in mirror image along the gate width (vertical direction in the drawing). Body contact areas 124, 125 126 and 127 are formed between the gate electrodes 114 and 116, 115 and 117, 120 and 122 and 121 and 123, respectively.

A power supply wiring is connected to the body contact areas 124 and 125 to maintain the potential of the p-type well region 111 at a low potential power supply voltage GND, and another power supply wiring is connected to the body contact areas 126 and 127 to maintain the substrate potential at a high potential power supply voltage $V_{dd}$.

Four MOS transistors shown by gate electrodes 112, 113, 118 and 119 are referred to as basic MOS transistors as they are located at the center of the basic cell 110 with respect to the gate length (lateral direction in the drawing), and eight MOS transistors having narrower gate electrodes 114-117, 120-123 located on both sides of the basic MOS transistors are referred to as additional MOS transistors. Namely, eight MOS transistors arranged on two outer wiring tracks 131 and 135 of the wiring tracks 131-135 are referred to as the additional MOS transistors, and four MOS transistors arranged on inner wiring tracks 132 and 134 are referred to as the basic MOS transistors.

A gate width $W_2$ of the additional MOS transistors is selected to meet $$W_2 < (W_1 - a)/2$$

Where $W_1$ is a gate width of the basic MOS transistor and $a$ is a vertical length (in the drawing) of the body contact areas 124-127. Accordingly, by arranging the body contact areas 124-127 at the center of the gate width (vertical direction) on the left and right sides of the basic MOS transistor, the additional MOS transistors can be arranged on upper and lower sides of the basic MOS transistor within the range of the gate width $W_1$ of the basic MOS transistor.

The body contact areas 124-127 are integrated with the body contact areas of the left and right adjacent basic cells 136 and 137. In other words, the body contact areas 124 and 126 extend leftward beyond the area of the basic cell 110 so that they may be used as the body contact area of the basic cell 136 as well. Similarly, the body contact areas 125 and 127 extend rightward so that they may be used as the body contact area of the basic cell 137 as well. By sharing the body contact area by the adjacent basic cells, the area of the body contact can be widened. In order aspect, assuming that a minimum area for one body contact area is given and the area of the body contacts is governed by that condition, the area of the body contact for one basic cell can be reduced to one half by the integration.

In order to integrate the body contact areas of the adjacent basic cells, it is necessary that the body contact areas are arranged laterally symmetrically. In the present embodiment, it is met because all body contact areas are arranged at the centers of the gate widths of the basic MOS transistors.

In the present embodiment, the additional MOS transistors are arranged on the upper and lower sides of the body contact areas 124-127, although they may be provided on either one of the upper and lower sides.

From the invention thus described, it will be obvious that the invention may be varied in many ways. Such variations are not to be regarded as a departure from the spirit and scope of the invention, an all such modifications as would be obvious to one skilled in the art are intended to be included within the scope of the following claims.

What is claimed is:

1. A CMOS master slice, comprising:
   a plurality of basic cells, said basic cells arranged in at least a column direction and defining first and second portions arranged in a row direction, each basic cell having a recessed portion and a projecting portion in the column direction, said projecting portion being complimentary in shape to said recessed portion;
   wherein each said basic cell comprises a group of p-channel MOS transistors and a group of n-channel MOS transistors;
   each said group of p- and n-channel transistors comprising a first transistor, said first transistor having a length measured in the column direction, a width measured in the row direction and a height measured in the row direction, at least one second transistor arranged on at least one side of said first transistor in the column direction having a width measured in the row direction and a height measured in the row direction, said height of said at least one second transistor being less than said height of said first transistor;
   said group of p-channel MOS transistors positioned at the first portion of said basic cell;
   said group of n-channel MOS transistors positioned at the second portion of said basic cell, wherein said second portion is located in a row direction from said first portion; and
   a gate of said at least one second transistor of one of said plurality of basic cells being arranged adjacent to a gate of at least one second transistor of another one of said plurality of basic cells in the row direction, wherein said basic cells are adjacent to each other in the column direction wherein the recessed portion of said one of the basic cells receives the projecting portion of said another basic cell.

2. A CMOS master slice according to claim 1, wherein:
   each of said group of p- and n-channel MOS transistors further comprises a plurality of first transistors having substantially equal heights.

3. A CMOS master slice according to claim 1, wherein:
   said second transistors of said p- and n-channel MOS transistor groups are arranged without overlap in the column direction.

4. A CMOS master slice according to claim 1, wherein:
   said second transistors on the projecting portion side of said first transistors of said p- and n-channel MOS transistor groups are adjacent in the row direction to define a combined length in the row direction substantially equal to a length of the recessed portion in the row direction; and
   said second transistors on the recessed portion side of said first transistors of said p- and n-channel MOS transistor groups are spaced from each other in the row direction by the length of the recessed portion in the row direction.

5. A CMOS master slice according to claim 1, wherein:
   a sum of heights of said second transistors of the p- and n-channel MOS transistor groups measured in the row direction, is no larger than the height of said first transistor measured in the row direction.

6. A CMOS master slice, comprising:
   a plurality of first basic cells having an upper portion and a lower portion arranged in the row direction;
   a plurality of second basic cells having an upper portion and a lower portion arranged in the row direction;
   wherein each of said plurality of first and second basic cells has a projecting portion on each side of said each cell in the column direction, a remainder of each side defining a recessed portion wherein when said cells are arranged adjacently in the row direction, the adjacent recessed portions define a combined recessed portion for receiving the projecting portion of an adjacent basic cell in the column direction;

wherein each of said first basic cells comprise a group of p-channel MOS transistors positioned at said upper portion of each said first basic cell and a group of n-channel MOS transistors positioned at said lower portion of each said first basic cell;

wherein each of said second basic cells comprise a group of p-channel MOS transistors positioned at said lower portion of each said second basic cell and a group of n-channel MOS transistors positioned at said upper portion of each said second basic cell;

each said group of p- and n-channel MOS transistors comprises a first transistor, said first transistor having a length measured in the column direction, a width measured in the row direction and a height measured in the row direction, at least one second transistor arranged on each side of said first transistor in the column direction, said at least one second transistor having a width measured in the row direction and a height measured in the row direction, said height of said at least one second transistor being less than said height of said first transistor; and wherein a gate of said at least one second transistor of said first basic cell is arranged adjacent to a gate of said at least one second transistor of said second basic cell in the column direction, said first basic cell adjacent to said second basic cell in the column direction, wherein said combined recessed portion of adjacent cells in the row direction receives said projecting portion of an adjacent cell in the column direction.

7. A CMOS master slice comprising:

a plurality of basic cells, said basic cells arranged in at least the column direction and defining first and second portions arranged in a row direction;

wherein each said basic cell comprises a group of p-channel MOS transistors and a group of n-channel MOS transistors;

each said group of p- and n-channel transistors comprising a first transistor, said first transistor having a length measured in the column direction, a width measured in the row direction and a height measured in the row direction, at least one second transistor arranged on at least one side of said first transistor in the column direction and having a width measured in the row direction and a height measured in the row direction, said height of said at least one second transistor being less than said height of said first transistor;

each said group of p- and n-channel transistors arranged in said basic cell in the row direction;

said second transistors of said p-channel transistor group arranged in the row direction from other said second transistors of said p-channel transistor group, and being spaced apart by a first predetermined distance, each said first predetermined distance defining a first spaced area, said second transistors of said n-channel transistor group being spaced apart from other said second transistors of said n-channel transistor group by a second predetermined distance, each said second predetermined distance defining a second spaced area; and a plurality of body contact areas common to adjacent basic cells in the column direction and having a height measured in the row direction, each said body contact area being formed in each said first and second spaced areas.

8. A CMOS master slice, according to claim 7, wherein:

each said group of p- and n-channel MOS transistors further comprising a plurality of first transistors having substantially equal heights.

9. A CMOS master slice according to claim 7, wherein:

said first transistors have opposing first and second sides arranged in the column direction;

each of a plurality of second transistors on said first side of the first transistor of each said p- and n-channel transistor groups is separated from an adjacent second transistor in the row direction by one of the first and second spaced areas, and have heights measured in the row direction, wherein a sum of the heights of said plurality of second transistors and the height of the body contact area is less than the height of said first transistor; and each of a plurality of second transistors on said second side of the first transistor of each said p- and n-channel transistor groups is separated from an adjacent second transistor in the row direction by one of the first and second spaced areas, and have heights measured in the row direction, wherein a sum of the heights of said plurality of second transistors and the height of the body contact area is less than the height of said first transistors.

10. A CMOS master slice according to claim 6, wherein:

a sum of heights of second transistors in the projecting portion of said first basic cell and second transistors of the projecting portion of the second basic cell adjacent to said second transistors in said projecting portion of said first basic cell in a row direction, is less than the height of first transistor in each said first basic cell and said second basic cell.

11. A CMOS master slice according to claim 6, wherein:

each said group of p- and n-channel MOS transistor further comprises a plurality of first transistors having substantially equal heights.

* * * * *

UNITED STATES PATENT AND TRADEMARK OFFICE
CERTIFICATE OF CORRECTION

PATENT NO. : 5,187,556

DATED : February 16, 1993

INVENTOR(S) : Masaaki Nariishi, Noboru Yamakawa, Osamu Ohba and Naoyasu Seki It is certified that error appears in the above-identified patent and that said Letters Patent is hereby corrected as shown below:

On title page, item [56], under "OTHER PUBLICATIONS" change

"No. 88" to read --No. 8B--.

Signed and Sealed this

Sixteenth Day of November, 1993

Attest:

BRUCE LEHMAN

Attesting Officer     Commissioner of Patents and Trademarks